US006088265A

United States Patent [19]
Ohta

[11] Patent Number: 6,088,265
[45] Date of Patent: Jul. 11, 2000

[54] VIRTUAL GROUND TYPE SEMICONDUCTOR STORAGE DEVICE

[75] Inventor: Yoshiji Ohta, Kashiwara, Japan

[73] Assignee: Sharp Kabushiki Kaisha, Osaka, Japan

[21] Appl. No.: 09/151,087

[22] Filed: Sep. 10, 1998

[30] Foreign Application Priority Data

Oct. 7, 1997 [JP] Japan .................................. 9-274272

[51] Int. Cl.[7] .............................................. G11C 16/04
[52] U.S. Cl. ................................ 365/185.16; 365/185.17
[58] Field of Search ........................ 365/185.16, 185.07, 365/185.17

[56] References Cited

U.S. PATENT DOCUMENTS

| | | | |
|---|---|---|---|
| 5,027,321 | 6/1991 | Park | 365/185.16 |
| 5,392,233 | 2/1995 | Iwase | 365/185.16 |
| 5,625,586 | 4/1997 | Yamasaki et al. | 365/185.16 |
| 5,875,128 | 2/1999 | Ishizuka | 365/185.05 |

FOREIGN PATENT DOCUMENTS 6-068683 3/1994 Japan .

*Primary Examiner*—David Nelms
*Assistant Examiner*—Van Thu Nguyen
*Attorney, Agent, or Firm*—Morrison & Foerster LLP

[57] ABSTRACT

In a virtual ground type semiconductor storage device, all of memory cells connected to one word line in blocks of eight memory cells are read in four sense operations. In each read operation, three consecutive main bit lines are discharged by a discharge signal and two memory cells which are each connected to both a discharged main bit line and a charged main bit line are used as read memory cells, whereby the influence of a leak current from both adjacent memory cells upon the read memory cells is suppressed to the minimum. Among adjust cells activated by an adjust signal, ones connected to only the charged main bit lines are designed as programmed cells to reduce a variation in leak current to a sense main bit line due to data retained in the memory cells connected to only the charged main bit lines.

6 Claims, 7 Drawing Sheets

| Number of Discharged Lines | Read Memory Cells | BL0 | BL1 | BL2 | BL3 | BL4 | BL5 | BL6 | BL7 |
|---|---|---|---|---|---|---|---|---|---|
| 1 | MC00 MC01 | 1 | 0 | 1 | 1 | 1 | 1 | 1 | 1 |
|   | MC02 MC03 | 1 | 1 | 1 | 0 | 1 | 1 | 1 | 1 |
|   | MC04 MC05 | 1 | 1 | 1 | 1 | 1 | 0 | 1 | 1 |
|   | MC06 MC07 | 1 | 1 | 1 | 1 | 1 | 1 | 1 | 0 |
| 2 | MC00 MC02 | 1 | 0 | 0 | 1 | 1 | 1 | 1 | 1 |
|   | MC01 MC03 | 1 | 1 | 0 | 0 | 1 | 1 | 1 | 1 |
|   | MC04 MC06 | 1 | 1 | 1 | 1 | 1 | 0 | 0 | 1 |
|   | MC05 MC07 | 1 | 1 | 1 | 1 | 1 | 1 | 0 | 0 |
| 4 | MC00 MC04 | 1 | 0 | 0 | 0 | 0 | 1 | 1 | 1 |
|   | MC01 MC05 | 1 | 1 | 0 | 0 | 0 | 0 | 1 | 1 |
|   | MC02 MC06 | 1 | 1 | 1 | 0 | 0 | 0 | 0 | 1 |
|   | MC03 MC07 | 1 | 1 | 1 | 1 | 0 | 0 | 0 | 0 |
| 5 | MC00 MC03 | 0 | 1 | 1 | 1 | 0 | 0 | 0 | 0 |
|   | MC02 MC05 | 0 | 0 | 0 | 1 | 1 | 1 | 0 | 0 |
|   | MC01 MC06 | 1 | 1 | 0 | 0 | 0 | 0 | 0 | 1 |
|   | MC04 MC07 | 0 | 0 | 0 | 0 | 0 | 1 | 1 | 1 |
| 6 | MC00 MC02 | 0 | 1 | 1 | 0 | 0 | 0 | 0 | 0 |
|   | MC01 MC03 | 0 | 0 | 1 | 1 | 0 | 0 | 0 | 0 |
|   | MC04 MC06 | 0 | 0 | 0 | 0 | 0 | 1 | 1 | 0 |
|   | MC05 MC07 | 0 | 0 | 0 | 0 | 0 | 0 | 1 | 1 |

VIRTUAL GROUND TYPE SEMICONDUCTOR STORAGE DEVICE

BACKGROUND OF THE INVENTION

The present invention relates to a virtual ground type semiconductor storage device.

In recent years, the capacities of semiconductor storage devices have been remarkably increased, and in order to cope with cost reduction, devices having a reduced effective cell area, such as the multi-valued system and the virtual ground system, have been introduced into the market one after another. In particular, the virtual ground system, which can achieve a small cell area merely by designing the circuit appropriately, allows the development of a device of a smaller chip area than the other systems even through the same process.

However, in the virtual ground system, because the drains and sources of memory cell transistors arranged in two adjacent columns are commonly connected to an identical virtual bit line, a leak current from the adjacent cells cannot be ignored. Therefore, to eliminate the effect of the leak current, according to devices that have been produced so far, a read operation is executed every eight bits in eight sense operations (prior art 1), as disclosed in Japanese Patent Laid-Open Publication No. HEI 6-68683.

Alternatively, the threshold voltage of memory cell transistors of every ninth bit is made higher than the threshold voltage (corresponding to stored data "0", "1") of the other memory cell transistors, thereby preventing the leak current (prior art 2).

FIG. 9 shows one block of a memory cell array disclosed in the Japanese Patent Laid-Open Publication No. HEI 6-68683. When reading data stored in a memory cell 1, a diffusion virtual ground line selection line 12 and a diffusion bit line selection line 10 as well as a word line 4 are pulled up to Vcc simultaneously, while a diffusion virtual ground line selection line 13 and a diffusion bit line selection line 11 are made to have the ground level. Then, a metal virtual ground line 15 is pulled down to the ground level by the operation of a pre-charge selection circuit 14, so that diffusion virtual ground lines 6 and 7 come to have the ground level. On the other hand, the other metal virtual ground lines 17, . . . come to have a pre-charge voltage Vpc by the operation of the other pre-charge selection circuits 16, 16, . . . , so that the other diffusion virtual ground lines 5, 8, 9, . . . come to have the pre-charge voltage Vpc. Also, a metal bit line 19 is selected by a Y-gate 18. Then, the diffusion bit line selection line 10 is pulled up to Vcc, and a diffusion bit line 3 is placed in a selected state since the diffusion bit line selection line 11 has the ground level.

In this state, the potential of the diffusion bit line 3 varies as shown in FIG. 10 depending on the data retained in the memory cell 1 and its adjacent memory cell 2. Therefore, by setting the inversion level of the sense amplifier to a position, indicated by the arrow, located lower than a level of (Vpc—Vth) and higher than a level approximately intermediate between (Vpc−Vth) and Vpc/2, the data retained in the memory cell 1 can be read regardless of the state of the adjacent memory cell 2. Subsequently, four diffusion bit lines are successively selected by means of the Y-gate 18 and diffusion bit line selection lines 10 and 11, and during this operation the voltages on the diffusion virtual ground line selection lines 12 and 13 are switched over for the inversion of the voltages applied to the diffusion virtual ground lines. Thus, the data retained in all the memory cells connected to one word line are read in eight sense operations.

However, the above prior art virtual ground type semiconductor storage devices have the following problems. That is, the semiconductor storage device disclosed in the Japanese Patent Laid-Open Publication No. HEI 6-68683 (prior art 1) necessitates eight sense operations as described above in order to read the data stored in all the memory cells connected to one word line. Therefore, it takes much time to read the stored data, so that a high-speed read operation is impossible.

On the other hand, in the second semiconductor storage device (prior art 2), invalid memory cells each constructed of a transistor having a threshold voltage higher than the threshold voltage of the normal memory cell transistor are arranged at intervals of eight bits, and this leads to a problem that the effective memory cell area is increased.

SUMMARY OF THE INVENTION

Accordingly, the object of the present invention is to provide a semiconductor storage device capable of reading all the memory cells connected in blocks to an identical word line in a reduced number of sense operations while suppressing the interference of the adjacent memory cells to the minimum without placing invalid memory cells.

In order to accomplish the above object, the present invention provides a semiconductor storage device of virtual ground type which has a plurality of non-volatile memory cells arranged in a matrix form, and bit lines and word lines connected to the non-volatile memory cells, comprising:

a power source for electrically charging the bit lines;

first switching means for effecting connection and disconnection between each bit line and the power source;

ground wiring which is grounded;

second switching means connected between each bit line and the ground wiring; and control means for controlling the second switching means to effect connection and disconnection between the ground wiring and at least one bit line per k consecutive bit lines (k: integer; k≧3), wherein a number of the at least one bit line is not larger than k−2, and when the number is two or more, the number of bit lines are consecutive bit lines.

In the semiconductor storage device, the bit lines are connected to the charging power source for a specified time by the first switching means, so that all the bit lines are charged. Thereafter, the one or more consecutive bit lines out of the k consecutive bit lines are connected to the ground wiring by the second switching means, so that the one or more bit lines are discharged. Therefore, by turning on a non-volatile memory cell connected to both a discharged bit line and a charged bit line, and sensing the voltage of the charged bit line connected to the non-volatile memory cell turned on, data retained in the non-volatile memory cell is read therefrom. In this case, there are two nonvolatile memory cells connected to both a discharged bit line and a charged bit line, and therefore, data retained in the two non-volatile memory cells are read at a time.

Furthermore, the potentials at two bit lines connected to each of two non-volatile memory cells adjacent to the non-volatile memory cell to be read are identical, and the two non-volatile memory cells to be read are positioned with their charged bit lines or their discharged bit lines arranged opposite to each other. Therefore, the influence of the leak current from the adjacent non-volatile memory cells on the non-volatile memory cells to be read is suppressed to the minimum.

In an embodiment, the second switching means comprise switching elements which are provided for every bit line, and the control means sequentially select different groups of the at least one bit line from among the k bit lines, and turn on and off the switching elements to connect only the selected bit line group to the ground wiring.

According to the above construction, a group of the at least one bit line to be connected to the ground wiring is selected from the k bit lines, and the bit line group is sequentially changed to another by the operation of the second switching means. In this case, the two nonvolatile memory cells to be read are also successively changed, so that all the non-volatile memory cells in blocks, each block having k memory cells, connected to one word are read in k/2 sense operations.

In an embodiment, two mutually adjacent bit lines that are not connected to the ground wiring are connected to each other via a resistor equivalent device.

According to the above construction, a leak current is generated via the resistor equivalent device between the mutually adjacent bit lines that are not connected to the ground wiring in reading the data retained in the non-volatile memory cells connected to both the discharged bit lines and the charged bit lines. By thus making the leak current flow from all the charged bit lines to the bit lines to be sensed, a variation in sense voltage due to the difference of the data retained in the nonvolatile memory cells adjacent to the charging side of the non-volatile memory cells to be read is reduced.

In an embodiment, the resistor equivalent device is comprised of a non-volatile memory cell, and the nonvolatile memory cell as the resistor equivalent device has a threshold voltage that allows a leak current to be generated in an ON-state of this non-volatile memory cell.

In an embodiment, mutually adjacent bit lines connected to the ground wiring are also connected to each other by a resistor equivalent device comprised of a non-volatile memory cell, this non-volatile memory cell having a threshold voltage that allows a leak current to be generated in an ON-state of the non-volatile memory cell.

According to the above construction, when the nonvolatile memory cell as the resistor equivalent device connected to the mutually adjacent bit lines that are connected to the ground wiring is turned on, a leak current is generated between the one or more bit lines connected to the ground wiring, so that the potentials at the bit lines to be grounded are adjusted approximately to an identical level regardless of the wire resistance.

In an embodiment, the resistor equivalent device connecting the two mutually adjacent two bit lines which are not connected to the ground wiring comprises a first transistor which has a source and a drain connected to these mutually adjacent two bit lines and a gate to which a first voltage is applied, and the resistor equivalent device connecting the two mutually adjacent two bit lines which are connected to the ground wiring comprises a second transistor which has a source and a drain connected to these mutually adjacent two bit lines and a gate to which a second voltage higher than the first voltage is applied.

According to the above construction, the first voltage is applied to the gate of the first transistor, while the second voltage is applied to the gate of the second transistor. Then, the first and second transistors are turned on to generate a leak current between the bit lines that are connected to the ground wiring and between the bit lines that are not connected to the ground wiring. In this case, the second voltage applied to the gate of the second transistor connected between the bit lines to be grounded is higher than the first voltage applied to the gate of the first transistor. Consequently, a low ON-state resistance is achieved, so that the bit lines to be grounded are rapidly discharged after these bit lines are connected to the ground wiring by the second switching means.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE PREFERRED EMBODIMENTS

The present invention will be described in detail below based on an embodiment thereof shown in the accompanying drawings.

Figure 1:
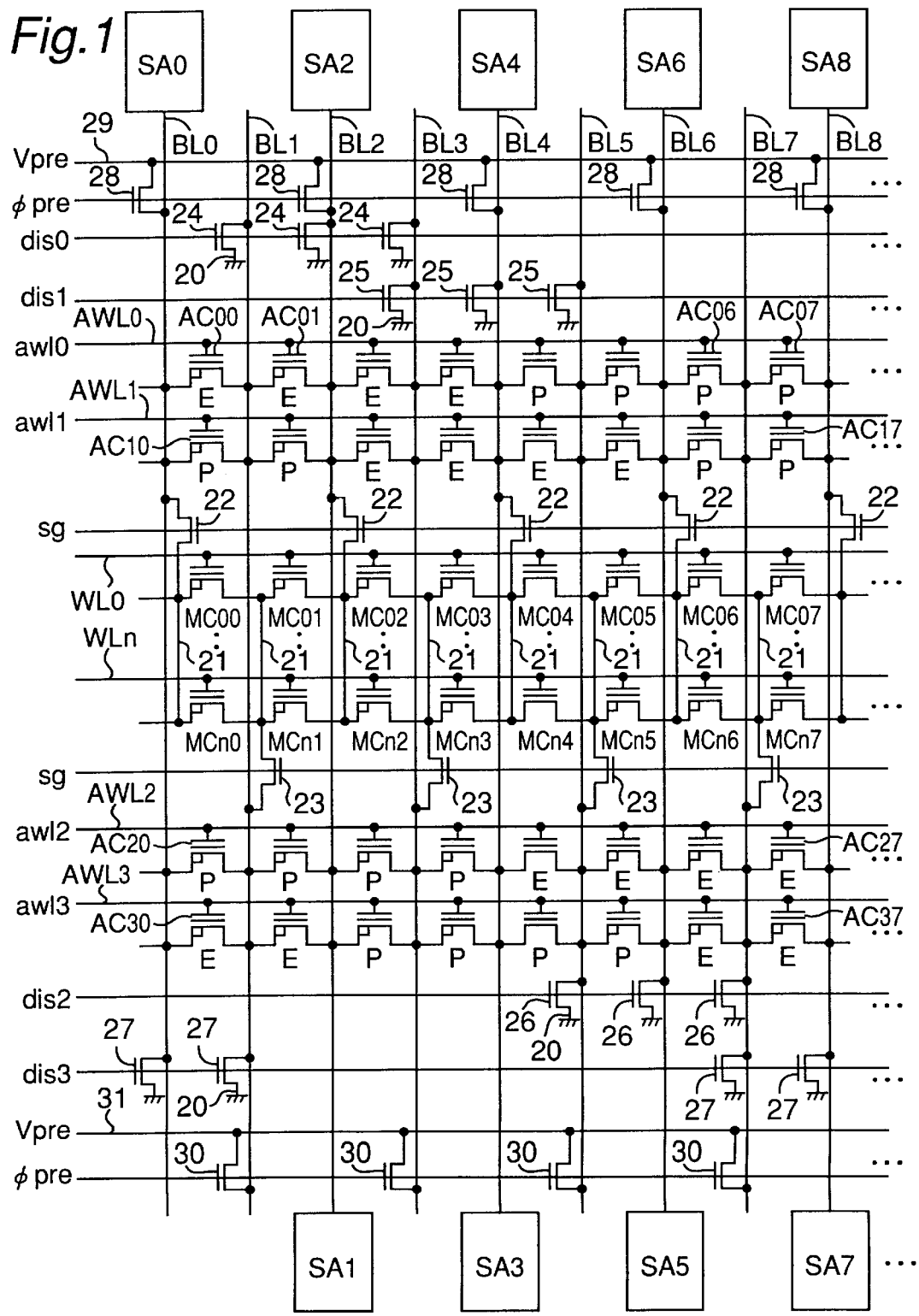
FIG. 1 is an equivalent circuit diagram of a semiconductor storage device according to the present invention.

FIG. 1 is an equivalent circuit diagram of a semiconductor storage device according to the present embodiment. A memory cell array is constructed by arranging $\{(n+1)\times(m+1)\}$ memory cell transistors (field-effect transistors provided with a floating gate) in a matrix form. The control gates of memory cell transistors (referred to simply as "memory cells" hereinafter) MC00 through MC0$m$ arranged in the first row are connected to a word line WL0. Likewise, the control gates of the memory cells MCn0 through MCn$m$ arranged in the (n+1)th row are connected to a word line WLn.

The memory cells MC are fabricated in a triple well and have diffusion areas n+ and diffusion areas n– which are placed in contact with the respective diffusion areas n+. The diffusion areas n– and n+ have asymmetrical concentration profiles. These diffusion areas n– and n+ constitute sub-bit lines 21 of the virtual ground system. To each sub-bit line 21 are connected the sources or drains of the (n+1) memory cells MC arranged in a column and the drains or sources of the (n+1) memory cells MC arranged in the adjacent column. The odd sub-bit lines 21 are connected to odd main bit lines BL0, BL2, . . . , BLm-1 via transistors 22, 22, . . . . A select gate selection signal sg is commonly supplied to the gates of the transistors 22, 22, . . . Further, the even sub-bit lines 21 are connected to even main bit lines BL1, BL3, . . . , BLm via transistors 23, 23, . . . whose gates are also commonly supplied with the select gate selection signal sg.

The above memory cell array is divided into a plurality of blocks of {(n+1)×8} memory cells, and the blocks have same constructions. The following description will be made based on an example having one block extending from the main bit line BL0 to the main bit line BL7.

The main bit lines BL1 through BL3 are grounded via ground wiring 20 and transistors 24, 24, . . . whose gates are supplied with a discharge signal dis0. The main bit lines BL3 through BL5 are grounded via ground wiring 20 and transistors 25, 25, . . . whose gates are supplied with a discharge signal dis1. The main bit lines BL5 through BL7 are grounded via ground wiring 20 and transistors 26, 26, . . . whose gates are supplied with a discharge signal dis2. The main bit lines BL0, BL1, BL7 (, BL8) are grounded via ground wiring 20 and transistors 27 whose gates are supplied with a discharge signal dis3.

Further, between adjacent main bit lines BL are connected resistor equivalent devices for positively generating a leak current between the adjacent main bit lines BL and approximately equalizing the value of the leak current from a charged main bit line BL to a read memory cell regardless of whether a memory cell adjacent to the read memory cell is in an erased state or a programmed state. In the present embodiment, the resistor equivalent devices are constructed of non-volatile memory cells (referred to as "adjust cells" hereinafter) AC00 through AC07 which are each comprised of a field-effect transistor provided with a floating gate and have control gates connected to an adjusted word line AWL0. Further, adjust cells AC10 through AC17 whose control gates are connected to an adjusted word. line AWL1, adjust cells AC20 through AC27 whose control gates are connected to an adjusted word line AWL2, and adjust cells AC30 through AC37 whose control gates are connected to an adjusted word line AWL3 are also provided as the resistor equivalent devices.

Among the adjust cells AC00 through AC07, the adjust cells AC00 through AC03 are erased cells (indicated by "E" in the figure) in which the threshold voltage of each of the transistors constituting these adjust cells is higher than an H-level voltage of an adjust signal aw10 supplied to the adjusted word line AWL0, while the adjust cells AC04 through AC07 are programmed cells (indicated by "P" in the figure) in which the threshold voltage of each of the transistors constituting these adjust cells is lower than the H-level voltage of the adjust signal aw10 supplied to the adjusted word line AWL0. Among the adjust cells AC10 through AC17, the adjust cells AC12 through AC15 are erased cells E, while the adjust cells AC10, AC11, AC16 and AC17 are programmed cells P. Among the adjust cells AC20 through AC27, the adjust cells AC24 through AC27 are erased cells E, while the adjust cells AC20 through AC23 are programmed cells P. Among the adjust cells AC30 through AC37, the adjust cells AC30, AC31, AC36 and AC37 are erased cells E, while the adjust cells AC32 through AC35 are programmed cells P.

The odd main bit lines BL0, BL2, BL4, BL6 and BL8 are connected to a charging line 29 to which a charge voltage Vpre is applied via transistors 28. To the gates of the transistors 28 is commonly supplied a charge signal φpre. Further, these main bit lines are connected at one end thereof to sense amplifiers SA0, SA2, SA4, SA6 and SA8. The other end of the main bit lines BL2, BL4, BL6 and BL8 is connected to sense amplifiers SA1, SA3, SA5 and SA7. On the other hand, the even main bit lines BL1, BL3, BL5 and BL7 are connected to a charging line 31 to which the charge voltage Vpre is applied from the power source Vpre via transistors 30 whose gates are supplied with the charge signal φpre.

Figure 2:
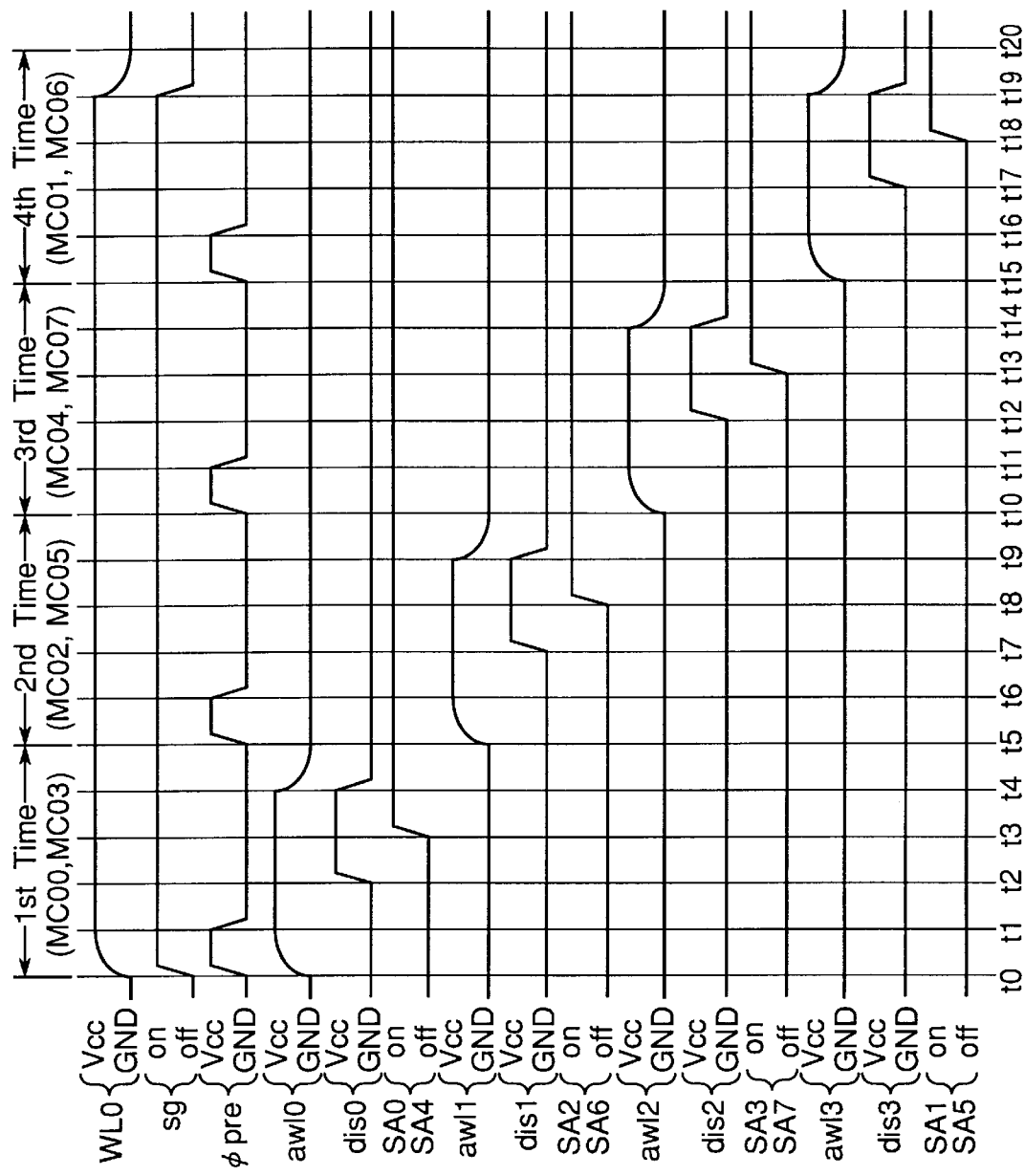
FIG. 2 is a timing chart of a read operation of the semiconductor storage device shown in FIG. 1.

The semiconductor storage device having the memory cell array of the above construction reads the data retained in all the memory cells MC connected to one word line WL in four sense operations as described in detail below. FIG. 2 is a timing chart of the operation timing of the above semiconductor storage device. The operation of the semiconductor storage device of the present embodiment will be described below with reference to FIG. 2 based on an example in which data are read from the memory cells MC00 through MC07 in the present block connected to the word line WL0. First, the word line WL0 connected to the memory cells MC00 through MC07 to be selected is made to have an H-level and the select gate selection signal sg is made to have an H-level, thereby connecting all the sub-bit lines 21 to the main bit lines BL for the start of a read operation.

(a) First Sense Operation (Read from Memory Cells MC00 and MC03)

The charge signal φpre is made to have an H-level at a time t0, whereby all the main bit lines BL are charged with the charge voltage Vpre (for example, 1 V). The adjust signal aw10 to be supplied to the adjusted word line AWL0 is made to rise.

The charge signal φpre is set to a L-level at a time t1. Thereafter, the discharge signal dis0 is made to have an H-level at a time t2, thereby discharging the main bit lines BL1 through BL3. In this stage, if the data retained in the memory cell MC00 is "0" (for example, the threshold voltage of the transistor constituting the memory cell MC00 is lower than the H-level (Vcc) of the word line WL0: a programmed cell), the main bit line BL0 is discharged via the associated sub-bit line 21, the memory cell MC00 and the main bit line BL1. Likewise, if the data retained in the memory cell MC03 is "0", the main bit line BL4 is discharged via the associated sub-bit line 21, the memory cell MC03 and the main bit line BL3. In contrast to this, if the data retained in the memory cells MC00 and MC03 are "1" (for example, the threshold voltage of the transistors is higher than the H-level (Vcc) of the word line WL0: erased cells), the main bit lines BL0 and BL4 are not discharged.

Then, the sense amplifiers SA0 and SA4 are driven at a time t3. Then, the voltages of the main bit lines BL0 and BL4 are detected by the sense amplifiers SA0 and SA4. If the voltage has been dropped, it is determined that the data retained in the memory cell MC00 or the memory cell MC03 is "0". If the voltage has not been dropped, it is determined that the data retained in the memory cell MC00 or the memory cell MC03 is "1". Then, the adjust signal aw10 is made to fall at a time t4, thereby making the discharge signal dis0 have an L-level. Thus, the first sense operation is completed.

In the above operation, the main bit lines BL1 through BL3 among the main bit lines BL0 through BL8 are discharged. By so doing, the potential of the main bit line BL2 adjacent to the discharge-side main bit line BL3 connected to the read memory cell MC03 is made equal to that of the main bit line BL3, while the potential of the main bit line BL5 adjacent to the charge-side (sense-side) main bit line BL4 connected to the read memory cell MC03 is made equal to that of the main bit line BL4. That is, the source potentials of the memory cells MC02 and MC04 adjacent to the read memory cell MC03 are made equal to their drain potentials, respectively. Also, the read memory cell MC03 and the read memory cell MC00, the latter being a read memory cell located closest to the former MC03, are arranged with their discharge sides made to face each other, and the distance between their charge sides is made as large as possible such that both are as far from each other as possible. Therefore, the influence of the leak current from the adjacent memory cells MC02 and MC04 on the read memory cell MC03 is suppressed to the minimum. It is true with the read memory cell MC00.

Among the adjust cells AC00 through AC07 activated by the adjust signal aw10, the adjust cells AC00 through AC03 connected to the main bit lines BL1 through BL3 discharged by the discharge signal dis0 are erased cells E, while the other adjust cells AC04 through AC07 are programmed cells P. With this arrangement, in reading data from the read memory cell MC03, a leak current flows into the main bit line BL4 through the adjust cells AC04–AC07 that are programmed cells P, so that a difference between the leak current occurring when all the memory cells MC04 through MC07 are erased cells and the leak current occurring when any one of the memory cells is a programmed cell (in other words, a variation in voltage of the main bit line BL4) is eliminated. That is, a difference in leak current between the case where the data retained in the memory cell adjacent to the read memory cell MC03 is "0" and the case where the retained data is "1" is eliminated. It is to be noted that the same thing can be said for the read memory cell MC00.

(b) Second Sense Operation (Read from Memory Cells MC02 and MC05)

The charge signal φpre is made to have an H-level at a time t5, whereby all the main bit lines BL are charged with the charge voltage Vpre. The adjust signal aw11 to be supplied to the adjusted word line AWL1 is made to rise.

The charge signal φpre is set to an L-level at a time t6. Thereafter, the discharge signal dis1 is made to have an H-level at a time t7, thereby discharging the main bit lines BL3 through BL5. Then, the sense amplifiers SA2 and SA6 are driven at a time t8 to detect the voltages of the main bit lines BL2 and BL6 to thereby determine the data of the memory cells MC02 and MC05. Then, the adjust signal aw11 is made to fall at a time t9, thereby making the discharge signal dis1 have an L-level. Thus, the second sense operation is completed.

In the above operation, the main bit lines BL3 through BL5 among the main bit lines BL0 through BL8 are discharged. Accordingly, the source potentials of the memory cells MC04 and MC06 adjacent to the read memory cell MC05 become equal to their drain potentials. Also, the read memory cell MC05 and the read memory cell MC02, the latter being a read memory cell located closest to the former, are arranged with their discharge sides made to face each other, and their charge sides are as far from each other as possible. Therefore, the influence of the leak current from the adjacent memory cells MC04 and MC06 upon the read memory cell MC05 is suppressed to the minimum. This holds true for the read memory cell MC02.

Among the adjust cells AC10 through AC17 activated by the adjust signal aw11, the adjust cells AC12 through AC15 connected to the main bit lines BL3 through BL5 discharged by the discharge signal dis1 are erased cells E, while the other adjust cells AC10, AC11, AC16 and AC17 are programmed cells P. Accordingly, in reading data from the read memory cell MC05, a difference in leak current between the case where all of the memory cells MC00, MC01, MC06 and MC07 are erased cells and the case where any one of those memory cells is a programmed cell is eliminated. This holds true for the read memory cell MC02.

(c) Third Sense Operation (Read from Memory Cells MC04 and MC07)

The charge signal φpre is made to have an H-level at a time t10, whereby all the main bit lines BL are charged with the charge voltage Vpre. The adjust signal aw12 to be supplied to the adjusted word line AWL2 is made to rise.

The charge signal φpre is set to an L-level at a time t11. Thereafter, the discharge signal dis2 is made to have an H-level at a time t12, thereby discharging the main bit lines BL5 through BL7. Then, the sense amplifiers SA3 and SA7 are driven at a time t13 to detect the voltages of the main bit lines BL4 and BL8 to thereby determine the data of the memory cells MC04 and MC07. Then, the adjust signal aw12 is made to fall at a time t14, thereby making the discharge signal dis2 have an L-level. In this way, the third sense operation is ended.

In the above operation, the main bit lines BL5 through BL7 among the main bit lines BL0 through BL8 are discharged. Accordingly, the source potentials of the memory cells MC03 and MC05 adjacent to the read memory cell MC04 become equal to their drain potentials, respectively. Also, the read memory cell MC04 and the read memory cell MC07, the latter being a read memory cell located closest to the former, are arranged with their discharge sides made to face each other, and their charge sides are separated from each other as much as possible. Therefore, the influence of the leak current from the adjacent memory cells MC03 and MC05 upon the read memory cell MC04 is suppressed to the minimum. This holds true for the read memory cell MC07.

Among the adjust cells AC20 through AC27 activated by the adjust signal aw12, the adjust cells AC24 through AC27 connected to the main bit lines BL5 through BL7 discharged by the discharge signal dis2 are erased cells E, while the other adjust cells AC20 through AC23 are programmed cells P. Accordingly, in reading the data from the read memory cell MC04, a difference in leak current between the case where all of the memory cells MC00 through MC03 are erased cells and the case where any one of those memory cells is a programmed cell is eliminated. This holds true for the read memory cell MC07.

(d) Fourth Sense Operation (Read from Memory Cells MC01 and MC06)

The charge signal φpre is made to have an H-level at a time t15, whereby all the main bit lines BL are charged with the charge voltage Vpre. The adjust signal aw13 to be supplied to the adjusted word line AWL3 is made to rise.

The charge signal φpre is set to an L-level at a time t16. Thereafter, the discharge signal dis3 is made to have an H-level at a time t17, thereby discharging the main bit lines BL0, BL1, BL7 and BL8. Then, the sense amplifiers SA1 and SA5 are driven at a time t18 to detect the voltages of the main bit lines BL2 and BL6 to thereby determine the data of the memory cells MC01 and MC06. Then, at a time t19, the level of the word line WL0 is made to fall, the select gate selection signal sg is made to have an L-level, the adjust signal aw13 is made to fall and the discharge signal dis3 is made to have an L-level. In this way, the third sense operation is completed.

In the above operation, the main bit lines BL0, BL1, BL7 and BL8 among the main bit lines BL0 through BL8 are discharged. Accordingly, the source potentials and the drain potentials of the memory cells MC00 and MC02 adjacent to the read memory cell MC01 are made equal to each other.

Also, the read memory cell MC01 and the read memory cell MC06, the latter being a read memory cell located closest to the former, are arranged with their charge sides made to face each other, and the charge sides are also separated from each other as much as possible. Therefore, the influence of the leak current from the adjacent memory cells MC00 and MC02 upon the read memory cell MC04 is suppressed to the minimum. This holds true for the read memory cell MC06.

Among the adjust cells AC30 through AC37 activated by the adjust signal aw13, the adjust cells AC30, AC31, AC36 and AC37 connected to the main bit lines BL0, BL1, BL7 and BL8 discharged by the discharge signal dis3 are erased cells E, while the other adjust cells AC32 through AC35 are programmed cells P. Accordingly, in reading the data from the read memory cell MC01, a difference in leak current between the case where all of the memory cells MC02 through MC05 are erased cells and the case where any one of those memory cells is a programmed cell is eliminated. This holds true for the read memory cell MC06.

As described above, in the present embodiment, the memory cells MC00 and MC03 are read in the first operation, the memory cells MC02 and MC05 are read in the second operation, the memory cells MC04 and MC07 are read in the third operation and the memory cells MC01 and MC06 are read in the fourth operation. Therefore, all the memory cells MC00 through MC07 in one block can be read in four operations. Then, by simultaneously executing same operations on all the blocks, reading of the data from all the memory cells MC00 through MC0m connected to the one word line WL0 is performed in four operations.

In the above case, all the memory cells MC are once charged with the charge voltage Vpre. Thereafter, with regard to one block, two inner ones of the four main bit lines BL connected to the two memory cells MC read in one read operation and also the main bit line or lines interposed between the two inner main bit lines are discharged. Alternatively, the other, two outer bit lines BL connected to the two memory cells MC respectively and also the main bit line or lines disposed outside of the two outer main bit lines are discharged.

Therefore, the source potentials and the drain potentials of the two memory cells MC adjacent to the read memory cell can be made equal to each other. Furthermore, both the read memory cells are arranged with their discharge sides or charge sides made to face each other, and the their charge sides are separated apart from each other as much as possible in the above state. As a result, the influence of the leak current from both adjacent memory cells upon the read memory cell is suppressed to the minimum. That is, the interval between the memory cells to be simultaneously read can be reduced, thereby allowing two of the eight memory cells MC in one block to be simultaneously read without any trouble.

Furthermore, the adjust cells AC connected to the main bit lines BL to be discharged are designed as erased cells E, while the other adjust cells AC are designed as programmed cells P. With this arrangement, in reading the data from the read memory cells, a leak current flows into the main bit lines BL to be sensed by the sense amplifiers SA, through the adjust cells AC (programmed cells P) connected to the charged main bit lines BL. Therefore, it is possible to reduce the difference between a leak current occurring when all of the memory cells MC having both sources and drains connected to the charged main bit lines are erased cells and a leak current occurring when any one of such memory cells is a programmed cell.

Figure 3:
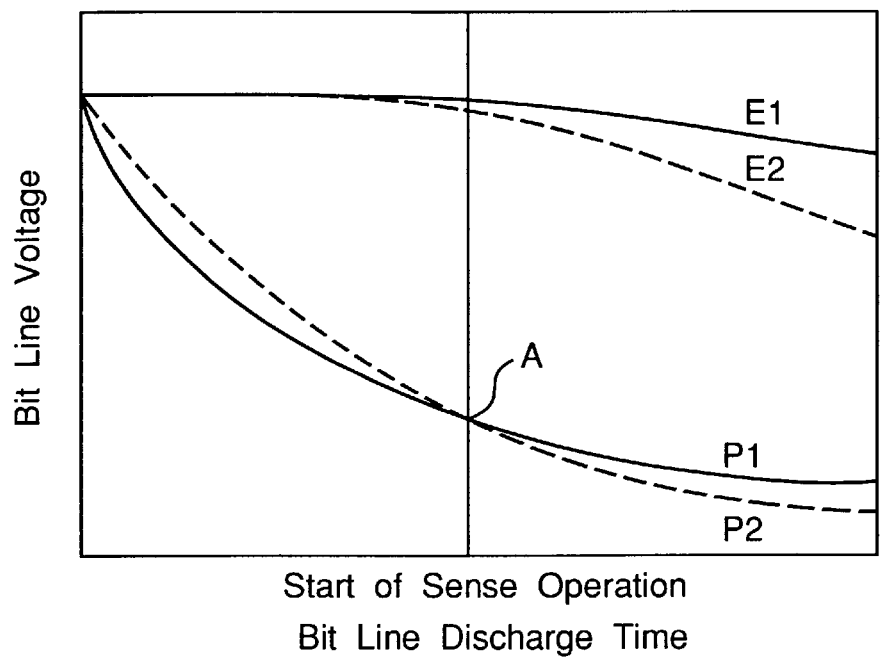
FIG. 3 is a graph showing influence of data held in adjacent memory cells on a voltage variation at a sense main bit line.
Figure 4:
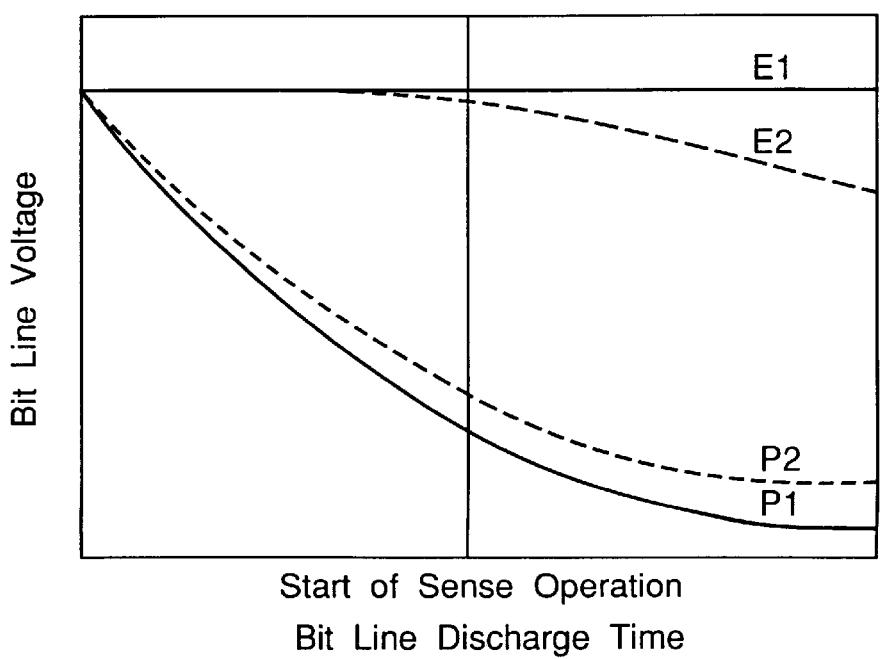
FIG. 4 is a graph showing influence of data retained in adjacent memory cells on a voltage variation at a sense main bit line in a prior art semiconductor storage device.

FIG. 3 shows a voltage variation of the main bit line BL sensed by the sense amplifier SA during one read operation. In the figure, a symbol "E" indicates the voltage variation in the case where the read memory cell is an erased cell, while a symbol "P" denotes a voltage variation in the case where the read memory cell is a programmed cell. A number "1" following the symbols "E" and "P" indicates that the adjacent memory cell is an erased cell, while a number "2" following the symbols indicates that the adjacent memory cell is a programmed cell. FIG. 4 shows a graph corresponding to FIG. 3 in the prior art semiconductor storage device that uses neither the adjusted word lines AWL nor the adjust cells AC.

FIG. 4 shows the fact that the influence of the leak current from the memory cell adjacent to the read memory cell upon the sense main bit line differs depending on whether the adjacent memory cell is an erased cell or a programmed cell in the case where neither the adjusted word lines AWL nor the adjust cells AC are used. Therefore, in the case of the prior art semiconductor storage device, the interval between the memory cells to be simultaneously read must be made great, so that the number of memory cells that can be simultaneously read within one block of eight memory cells is one at the very most. As a result, eight sense operations are required for the reading of the memory cells divided into blocks of eight memory cells.

In contrast to this, the semiconductor storage device of the present embodiment, a leak current flows into the main bit lines BL to be sensed through the adjust cells AC (programmed cells P) connected to the charged main bit lines BL. With this arrangement, as is obvious from FIG. 3, whether the adjacent memory cell is an erased cell or a programmed cell, the leak current from the adjacent memory cell does not differ very much, and there exists a point A at which both the curves intersect. Therefore, by setting the start time of the sense operation at this point A, a variation in voltage of the sense main bit line due to the leak current from the adjacent memory cell is reduced. Therefore, the interval between the memory cells to be simultaneously read can be reduced, which allows the memory cells constituting blocks of eight memory cells to be read in four sense operations.

Figure 5:
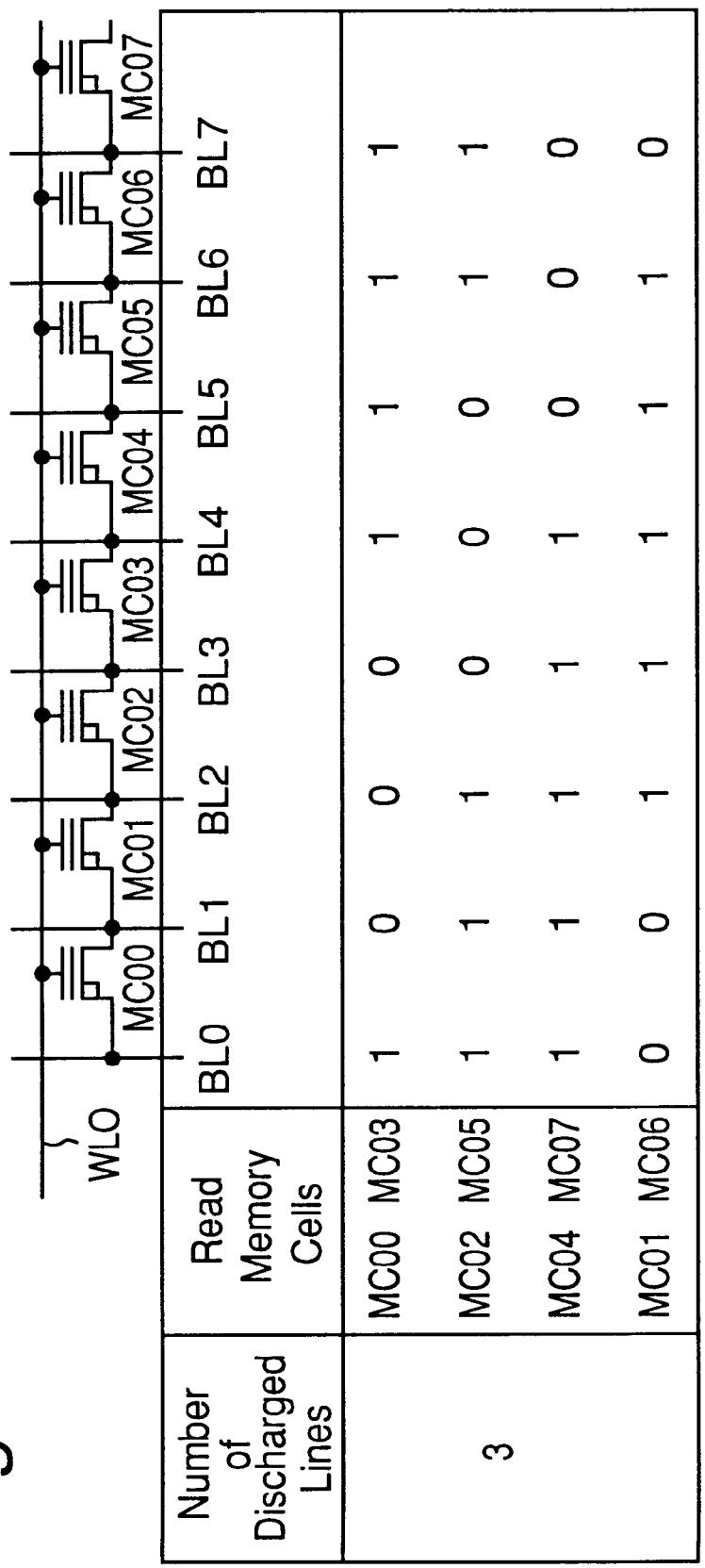
FIG. 5 is a diagram showing a relation between the discharge main bit lines and the read memory cells.

In the above embodiment in which the three main bit lines BL are discharged with respect to one block of eight main bit lines BL, there is a relationship between the discharged main bit lines and the read memory cells as shown in FIG. 5. In FIG. 5, a number "0" represents the discharged main bit line, while a number "1" represents the charged main bit line. Beside the numbers "0" and "1" representing the discharged/charged lines are shown the read memory cells for the case. As is obvious from FIG. 5, by selecting as the read memory cells two memory cells MC in which either the source or the drain is connected to a discharged main bit line and the other is connected to a charged main bit line, the following is achieved.

(1) The source potentials of both memory cells adjacent to the read memory cell are made equal to the respective drain potentials; and (2) A first read memory cell and a second read memory cell closest to the first read memory cell have their discharge sides or the charge sides faced toward each other, and their charge sides are separated apart from each other as far as possible in that state.

Figure 6:
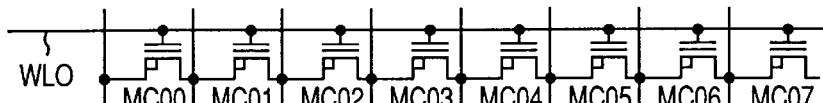
FIG. 6 is a diagram showing a relation between the discharge main bit lines and the read memory cells in the case where one, two, four through six of the eight main bit lines are discharged in one block.

The two read memory cells MC in which one of the source and the drain is connected to a discharged main bit line and the other is connected to a charged main bit line, can be achieved not only by discharging three main bit lines BL per one block of eight main bit lines BL in one read operation as described above, but also by discharging one main bit line BL, two main bit lines BL, four main bit lines BL five main bit lines BL, or six main bit lines BL, as shown in FIG. 6. That is, the above arrangement can be achieved by discharging, in one operation, one or more, but not more than k−2 main bit lines per block that are consecutively arranged (where k is the number of main bit lines BL in one block, and the number 2 indicates the number of read memory cells). It is to be noted in this case that the positions and the number of programmed cells P in the adjust cells AC are required to be changed according to the change in position and number of the discharged main bit lines.

Figure 7:
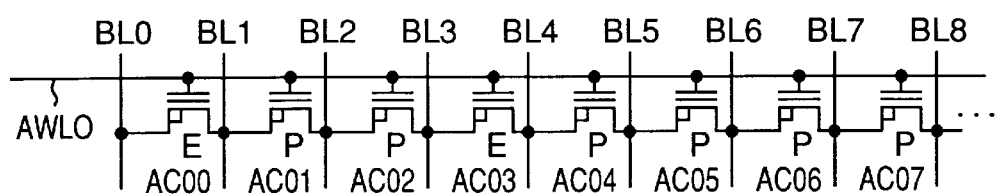
FIG. 7 is a diagram showing the construction of adjust cells AC different from those of FIG. 1.

Furthermore, the arrangement of the adjust cells AC is not limited to that shown in FIG. 1. FIG. 7 shows another example of the arrangement of the adjust cells AC00 through AC07 in FIG. 1.

In FIG. 7, only the adjust cells AC00 and AC03 connected to the same main bit lines BL0, BL1, BL3 and BL4 as those to which the read memory cells MC00 and MC03 are connected constitute erased cells E, and the other adjust cells AC01, AC02, and AC04 through AC07 constitute programmed cells P. By thus designing the adjust cells AC01 and AC02 as the programmed cells P, the potentials of the main bit lines BL1 through BL3 prior to the discharging can be approximately equalized regardless of the difference in wire resistance and the like between these main bit lines, thereby allowing the time of discharging the main bit lines BL1 through BL3 to be equalized.

In the above embodiment, the adjusted word lines AWL and the adjust cells AC which are non-volatile memory cells are used as the resistor equivalent devices for eliminating the variation in leak current from the adjacent memory cell to the read memory cell whether the adjacent memory cell is the erased cell or the programmed cell. However, the present invention is not limited to this, and any other resistor equivalent device can be used so long as the device generates a leak current as described above. When the non-volatile memory cells are used as the resistor equivalent devices, however, the same non-volatile memory cells as those used for storing data can be employed so that the area occupied by the resistor equivalent devices can be reduced.

Figure 8:
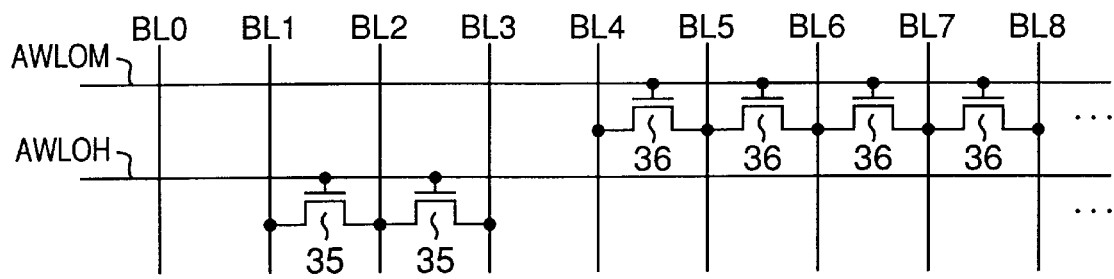
FIG. 8 is a diagram showing the construction of resistor equivalent devices different from those of FIG. 1.
Figure 9:
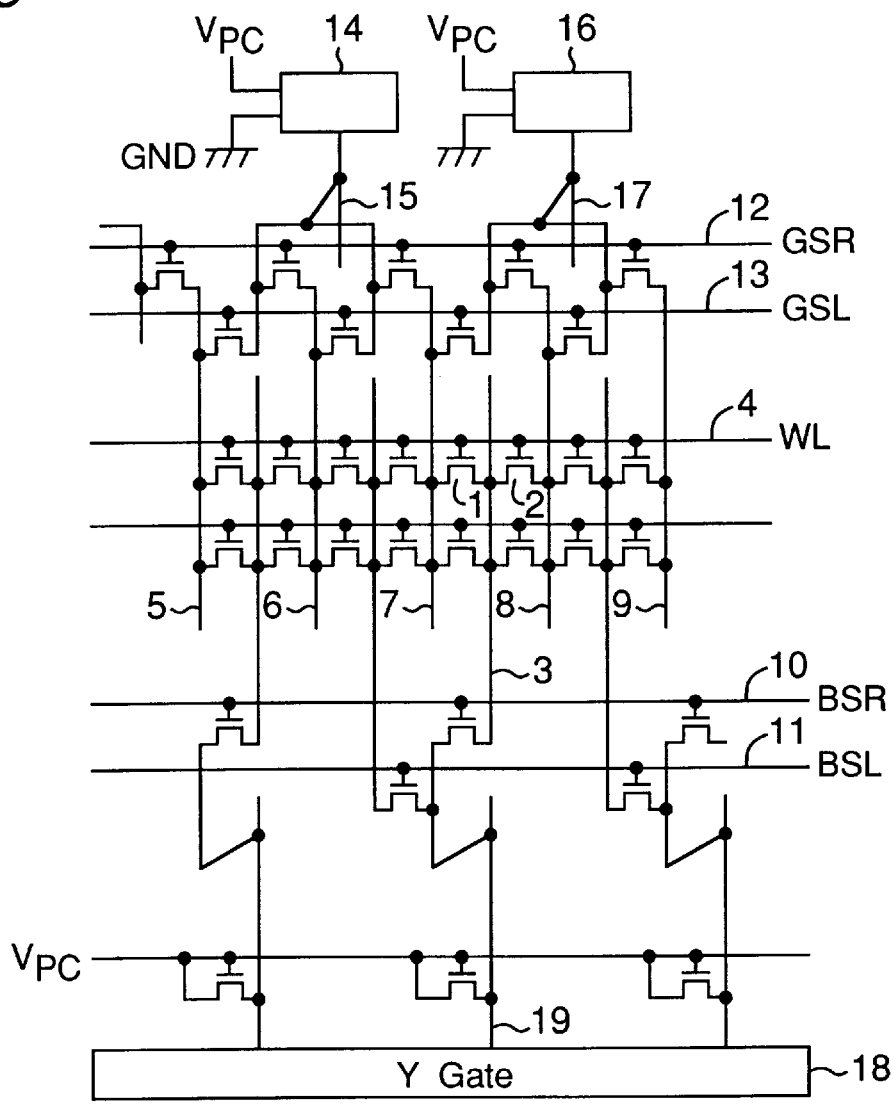
FIG. 9 is an equivalent circuit diagram of a prior art semiconductor storage device.
Figure 10:
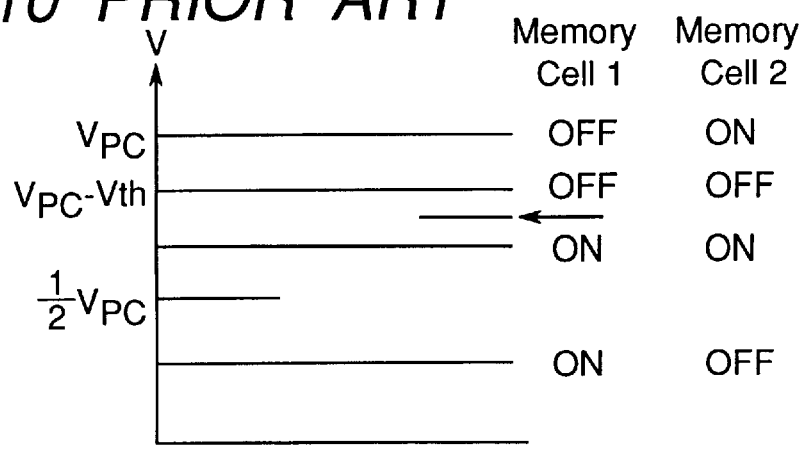
FIG. 10 is a diagram showing a potential at a diffusion bit line depending on the data retained in the sense memory cell and the adjacent memory cell in the semiconductor storage device shown in FIG. 9.

FIG. 8 shows another example of the resistor equivalent devices. In FIG. 8, two transistors 35 whose gates are connected to an adjusted word line AWL0H are used as devices corresponding to the adjust cells AC01 and AC02 connected to the main bit lines BL1 through BL3 to be discharged among the adjust cells AC01, AC02, and AC04 through AC07 that serve as the programmed cells P in FIG. 7. On the other hand, four transistors 36 whose gates are connected to another adjusted word line AWL0M are used as devices corresponding to the programmed adjust cells AC04 through AC07 of FIG. 7 connected to the main bit lines BL4 through BL8 that are not discharged. In this case, it is preferable to provide a low resistance between the main bit lines BL1 through BL3 to be discharged, and therefore, a high voltage is applied to the adjusted word line AWL0H. On the other hand, it is preferable to provide a high resistance between the main bit lines BL4 through BL8 that are not discharged, and therefore, a low voltage is applied to the adjusted word line AWL0M.

The memory cell MC is not limited to the memory cell that is fabricated in a triple well and includes the diffusion area n+ and the diffusion area n− having asymmetrical concentration profiles as described above, and an ordinary NOR-type memory cell is also acceptable. The described embodiment implements both the discharging of the one to k−2 main bit lines BL among the k main bit lines BL in one block and the connection between all the main bit lines via the resistor equivalent devices. However, the present invention permits the implementation of either one of them.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A virtual ground type semiconductor storage device including a plurality of non-volatile memory cells arranged in a matrix form and bit lines and word lines connected to the non-volatile memory cells, comprising:

a power source for electrically charging the bit lies;

first switching means for effecting connection and disconnection between each bit line and the power source;

ground wiring which is grounded;

second switching means connected between each bit line and the ground wiring;

a plurality of groups of k consecutive bit lines (k: integer; k≧3) among the bit lines; and means for controlling the second switching means to effect connection and disconnection between the ground wiring and at least one bit line of each group of k consecutive bit lines, wherein a number of the at least one bit line is not larger than k−2, and when the number of the at least one bit line is two or more, then these bit lines are consecutive bit lines.

2. The semiconductor storage device as claimed in claim 1, wherein said second switching means comprises switching elements which are provided for each bit line, and said controlling means sequentially selects different groups of the at least one bit line from each group of k consecutive bit lines, and turns on and off the switching elements to connect only the selected group of the at least one bit line to said ground wiring.

3. The semiconductor storage device as claimed in claim 1, wherein mutually adjacent bit lines that are not connected to the grounding wiring are connected to each other via a resistor equivalent device.

4. The semiconductor storage device as claimed in claim 3, wherein said resistor equivalent device is comprised of a non-volatile memory cell; and said non-volatile memory cell as the resistor equivalent device has a threshold voltage that allows a leak current to be generated in an ON-state of this non-volatile memory cell.

5. A semiconductor storage device as claimed in claim 4, wherein mutually adjacent bit lines connected to the ground wiring are connected to each other by a resistor equivalent device comprised of a non-volatile memory cell, this non-volatile memory cell having a threshold voltage that allows a leak current to be generated in an ON-state of the non-volatile memory cell.

6. A semiconductor storage device as claimed in any one of claims 1–3, wherein mutually adjacent bit lines that are connected to the grounding wiring are connected to each other via a resistor equivalent device;

the resistor equivalent device connecting the mutually adjacent two bit lines which are not connected to the ground wiring comprises a first transistor which has a source and a drain connected to these mutually adjacent bit lines and a gate to which a first voltage is applied; and the resistor equivalent device connecting the two mutually adjacent two bit lines which are connected to the ground wiring comprises a second transistor which has a source and a drain connected to these mutually adjacent two bit lines and a gate to which a second voltage higher than the first voltage is applied.

* * * * *